(12) United States Patent
Campbell et al.

(10) Patent No.: US 8,813,515 B2
(45) Date of Patent: Aug. 26, 2014

(54) THERMOELECTRIC-ENHANCED, VAPOR-COMPRESSION REFRIGERATION APPARATUS FACILITATING COOLING OF AN ELECTRONIC COMPONENT

(75) Inventors: Levi A. Campbell, Poughkeepsie, NY (US); Richard C. Chu, Hopewell Junction, NY (US); Michael J. Ellsworth, Jr., Lagrangeville, NY (US); Madhusudan K. Iyengar, Woodstock, NY (US); Robert E. Simons, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 312 days.

(21) Appl. No.: 12/939,574

(22) Filed: Nov. 4, 2010

(65) Prior Publication Data

US 2012/0111027 A1    May 10, 2012

(51) Int. Cl.
*F25D 23/12*    (2006.01)

(52) U.S. Cl.
USPC ............................................. 62/259.2; 62/3.2

(58) Field of Classification Search
USPC ......... 62/259.2, 259.4, 3.1, 3.2, 176.3, 228.1, 62/141, 125, 126
See application file for complete search history.

(56) References Cited

U.S. PATENT DOCUMENTS

| | | |
|---|---|---|
| 4,000,626 A | 1/1977 | Webber |
| 4,091,637 A | 5/1978 | Vogel et al. |
| 4,313,310 A | 2/1982 | Kobayashi et al. |
| 4,571,951 A | 2/1986 | Szymaszek |
| 4,598,764 A | 7/1986 | Beckey |
| 4,831,830 A | 5/1989 | Swenson |

(Continued)

FOREIGN PATENT DOCUMENTS

| | | | |
|---|---|---|---|
| CN | 1734212 A | * | 2/2006 |
| DE | 29903863 U1 | | 11/1999 |

(Continued)

OTHER PUBLICATIONS

Torok et al., "Packaging Design of the IBM System z10 Enterprise Class Platform Central Electronic Complex", IBM Journal of Research & Development, vol. 53, No. 1, Paper 9 (2009).

(Continued)

*Primary Examiner* — Cheryl J Tyler
*Assistant Examiner* — Ana Vazquez
(74) *Attorney, Agent, or Firm* — Steven Chiu, Esq.; Kevin P. Radigan, Esq.; Heslin Rothenberg Farley & Mesiti P.C.

(57) ABSTRACT

Apparatus and method are provided for facilitating cooling of an electronic component. The apparatus includes a refrigerant loop, a compressor coupled to the refrigerant loop, and a controllable thermoelectric array disposed in thermal communication with the refrigerant loop. Refrigerant flowing through the refrigerant loop facilitates dissipation of heat from the electronic component, and the thermoelectric array is disposed with a first portion of the refrigerant loop, residing upstream of the compressor, in thermal contact with a first side of the array, and a second portion of the refrigerant loop, residing downstream of the compressor, in thermal contact with a second side of the array. The thermoelectric array ensures that refrigerant in the refrigerant loop entering the compressor is in a superheated thermodynamic state by transferring heat from refrigerant passing through the second portion to refrigerant passing through the first portion of the refrigerant loop.

16 Claims, 8 Drawing Sheets

(56) References Cited

U.S. PATENT DOCUMENTS

| | | | |
|---|---|---|---|
| 4,934,155 | A | 6/1990 | Lowes |
| 4,993,481 | A | 2/1991 | Kamimoto et al. |
| 5,060,481 | A | 10/1991 | Bartlett et al. |
| 5,217,063 | A | 6/1993 | Scaringe et al. |
| 5,412,884 | A | 5/1995 | Staples et al. |
| 5,514,595 | A | 5/1996 | Olds et al. |
| 5,597,533 | A | 1/1997 | Olds et al. |
| 5,737,923 | A | 4/1998 | Gilley et al. |
| 5,860,280 | A | 1/1999 | Recine, Sr. et al. |
| 5,867,990 | A | 2/1999 | Ghoshal et al. |
| 5,963,458 | A | 10/1999 | Cascia |
| 5,970,731 | A | 10/1999 | Hare et al. |
| 6,003,319 | A | 12/1999 | Gilley et al. |
| 6,037,567 | A | 3/2000 | Inoue et al. |
| 6,164,076 | A | 12/2000 | Chu et al. |
| 6,213,194 | B1 | 4/2001 | Chrysler et al. |
| 6,305,463 | B1 | 10/2001 | Salmonson |
| 6,351,950 | B1 | 3/2002 | Duncan |
| 6,397,618 | B1 | 6/2002 | Chu et al. |
| 6,474,074 | B2 | 11/2002 | Choshal |
| 6,557,354 | B1 | 5/2003 | Chu et al. |
| 6,705,089 | B2 | 3/2004 | Chu et al. |
| 6,747,872 | B1 | 6/2004 | Patel et al. |
| 6,760,221 | B2 | 7/2004 | Goth et al. |
| 6,786,081 | B1 | 9/2004 | Hildebrandt et al. |
| 6,820,435 | B2 | 11/2004 | Anderson et al. |
| 6,829,145 | B1 | 12/2004 | Corrado et al. |
| 6,845,622 | B2 | 1/2005 | Sauciuc et al. |
| 6,993,920 | B2 | 2/2006 | Lifson et al. |
| 7,073,341 | B2 | 7/2006 | Tongu et al. |
| 7,085,626 | B2 | 8/2006 | Harrod et al. |
| 7,086,247 | B2 | 8/2006 | Campbell et al. |
| 7,089,752 | B2 | 8/2006 | Jeong et al. |
| 7,278,269 | B2 | 10/2007 | Pham et al. |
| 7,310,953 | B2 | 12/2007 | Pham et al. |
| 7,342,787 | B1 | 3/2008 | Bhatia |
| 7,382,047 | B2 | 6/2008 | Chen et al. |
| 7,401,472 | B2 | 7/2008 | Manole |
| 7,554,808 | B2 | 6/2009 | Scott et al. |
| 7,626,407 | B2 | 12/2009 | Kabbani |
| 7,788,937 | B2 | 9/2010 | Kawakatsu et al. |
| 7,788,941 | B2 | 9/2010 | Campbell et al. |
| 7,963,119 | B2 * | 6/2011 | Campbell et al. ............ 62/259.2 |
| 8,018,718 | B2 | 9/2011 | Goth et al. |
| 2001/0000880 | A1 | 5/2001 | Chu et al. |
| 2002/0145439 | A1 | 10/2002 | Gaasch et al. |
| 2003/0000231 | A1 | 1/2003 | Pokhama et al. |
| 2003/0014987 | A1 | 1/2003 | Levenduski et al. |
| 2005/0122685 | A1 | 6/2005 | Chu et al. |
| 2005/0262869 | A1 | 12/2005 | Tongu et al. |
| 2005/0262870 | A1 | 12/2005 | Narayanamurthy et al. |
| 2006/0042289 | A1 | 3/2006 | Campbell et al. |
| 2007/0044493 | A1 * | 3/2007 | Kearney et al. ............. 62/259.2 |
| 2007/0062181 | A1 | 3/2007 | Williamson et al. |
| 2007/0107453 | A1 | 5/2007 | Cutting et al. |
| 2007/0199335 | A1 | 8/2007 | Innes |
| 2008/0307806 | A1 | 12/2008 | Campbell et al. |
| 2009/0038317 | A1 | 2/2009 | Otey |
| 2009/0126909 | A1 * | 5/2009 | Ellsworth et al. ........ 165/104.33 |
| 2009/0158768 | A1 | 6/2009 | Rafalovich et al. |
| 2010/0005820 | A1 | 1/2010 | Harig |
| 2010/0073863 | A1 | 3/2010 | Matsushima et al. |
| 2010/0079952 | A1 | 4/2010 | Liang et al. |
| 2010/0200197 | A1 | 8/2010 | Bezama et al. |
| 2011/0180241 | A1 | 7/2011 | So et al. |
| 2011/0197612 | A1 | 8/2011 | Campbell et al. |
| 2012/0111028 | A1 | 5/2012 | Campbell et al. |
| 2012/0111034 | A1 | 5/2012 | Campbell et al. |
| 2012/0111035 | A1 | 5/2012 | Campbell et al. |
| 2012/0111036 | A1 | 5/2012 | Campbell et al. |
| 2012/0111037 | A1 | 5/2012 | Campbell et al. |
| 2012/0125022 | A1 | 5/2012 | Maybury et al. |
| 2012/0125573 | A1 | 5/2012 | Rubenstein et al. |
| 2012/0210731 | A1 | 8/2012 | Campbell et al. |

FOREIGN PATENT DOCUMENTS

| | | |
|---|---|---|
| DE | 19903743 A1 | 8/2000 |
| EP | 0025665 A1 | 3/1981 |
| EP | 1031808 A2 | 8/2000 |
| JP | 1098885 A | 4/1989 |
| JP | 10223442 A | 8/1998 |
| JP | 2006162246 A | 6/2006 |
| JP | 2006-278923 A | 10/2006 |
| JP | 2008014563 A | 1/2008 |
| JP | 2010-121930 A | 6/2010 |
| KR | 2005-026591 A | 3/2005 |
| WO | WO2010017536 A2 | 2/2010 |

OTHER PUBLICATIONS

Ellsworth, Jr. et al., "The Evolution of Water Cooling for IBM Larger Server Systems: Back to the Future", IBM Corporation, Poughkeepsie, NY (2008).

International Search Report and Written Opinion from International Application No. PCT/EP2008/055758, dated Oct. 29, 2008.

Simons, Robert E., "Application of Thermoelectric Coolers for Module Cooling Enhancement" (http://www.electronics-cooling.com/2000/05/application-of-thermoelectric-coolers-for-module-cooling-enhancement/) (May 1, 2000).

Tellurex, "An Introduction to Thermoelectrics", (http://www.tellurex.com/pdf/introduction-to-thermoelectrics.pdf) (2010).

Tellurex, "An Introduction to Temperature Control of Thermoelectric Systems", (http://www.tellurex.com/pdf/introduction-to-temperature-control.pdf) (2010).

Tellurex, "Frequently Asked Questions About Our Power Generation Technology", (http://www.tellurex.com/pdf/seebeck-faq.pdf) (2010).

Tellurex, "Frequently Asked Questions About Our Cooling and Heating Technology", (http://www.tellurex.conn/pdf/peltier-faq.pdf) (2010).

Campbell et al., Office Action for U.S. Appl. No. 12/939,535, filed Nov. 4, 2010 (U.S. Patent Publication No. 2012/0111036 A1), dated Jun. 18, 2013 (19 pgs.).

Campbell et al., Final Office Action for U.S. Appl. No. 12/939,552, filed Nov. 4, 2010 (U.S. Patent Publication No. 2012/0111037 A1), dated Jul. 5, 2013 (36 pgs.).

Campbell et al., Final Office Action for U.S. Appl. No. 12/939,541, filed Nov. 4, 2010 (U.S. Patent Publication No. 2012/0111034 A1), dated Jul. 30, 2013 (19 pgs.).

Campbell et al., Office Action for U.S. Appl. No. 12/939,563, filed Nov. 4, 2010 (U.S. Patent Publication No. 2012/0111038 A1), dated Feb. 27, 2013.

Campbell, et al., Office Action for U.S. Appl. No. 13/451,668, filed Apr. 20, 2012, (U.S. Patent Publication No. 2012/0210731 A1 ), dated Dec. 3, 2012.

Campbell et al., Office Action for U.S. Appl. No. 12/939,541, filed Nov. 4, 2010, (U.S. Patent Publication No. 2012/0111034 A1 ), dated Dec. 11, 2012.

Campbell et al., Office Action for U.S. Appl. No. 12/939,552, filed Nov. 4, 2010, (U.S. Patent Publication No. 2012/0111037 A1), dated Dec. 13, 2012.

Campbell et al., Office Action for U.S. Appl. No. 12/939,569, filed Nov. 4, 2010, (U.S. Patent Publication No. 2012/0111028 A1 ), dated Dec. 18, 2012.

Campbell et al., Office Action for U.S. Appl. No. 12/939,535, filed Nov. 4, 2010, (U.S. Patent Publication No. 2012/0111036 A10), dated Dec. 19, 2012.

Campbell et al., Office Action for U.S. Appl. No. 12/939,546, filed Nov. 4, 2010, (U.S. Patent Publication No. 2012/0111035 A1), dated Jan. 2, 2013.

Campbell et al., Notice of Allowance for U.S. Appl. No. 13/451,668, filed Apr. 20, 2012 (U.S. Patent Publication No. 2012/0210731 A1), dated Sep. 20, 2013 (25 pages).

Campbell et al., Final Office Action for U.S. Appl. No. 12/939,563, filed Nov. 4, 2010 (U.S. Patent Publication No. 2012/0111038 A1), dated Oct. 22, 2013 (23 pages).

(56) References Cited

OTHER PUBLICATIONS

Campbell et al., Notice of Allowance for U.S. Appl. No. 12/939,535, filed Nov. 4, 2010 (U.S. Patent Publication No. 2012/0111036 A1), dated Nov. 22, 2013 (17 pages).

Campbell et al., Final Office Action for U.S. Appl. No. 12/939,569, filed Nov. 4, 2010 (U.S. Patent Publication No. 2012/0111028 A1), dated Dec. 16, 2013 (14 pages).

Campbell et al., Office Action for U.S. Appl. No. 12/939,541, filed Nov. 4, 2010 (U.S. Patent Publication No. 2012/0111034 A1), dated Dec. 18, 2013 (21 pages).

Campbell et al., Final Office Action for U.S. Appl. No. 12/939,546, filed Nov. 4, 2010 (U.S. Patent Publication No. 2012/0111035 A1), dated Apr. 9, 2014 (22 pages).

\* cited by examiner

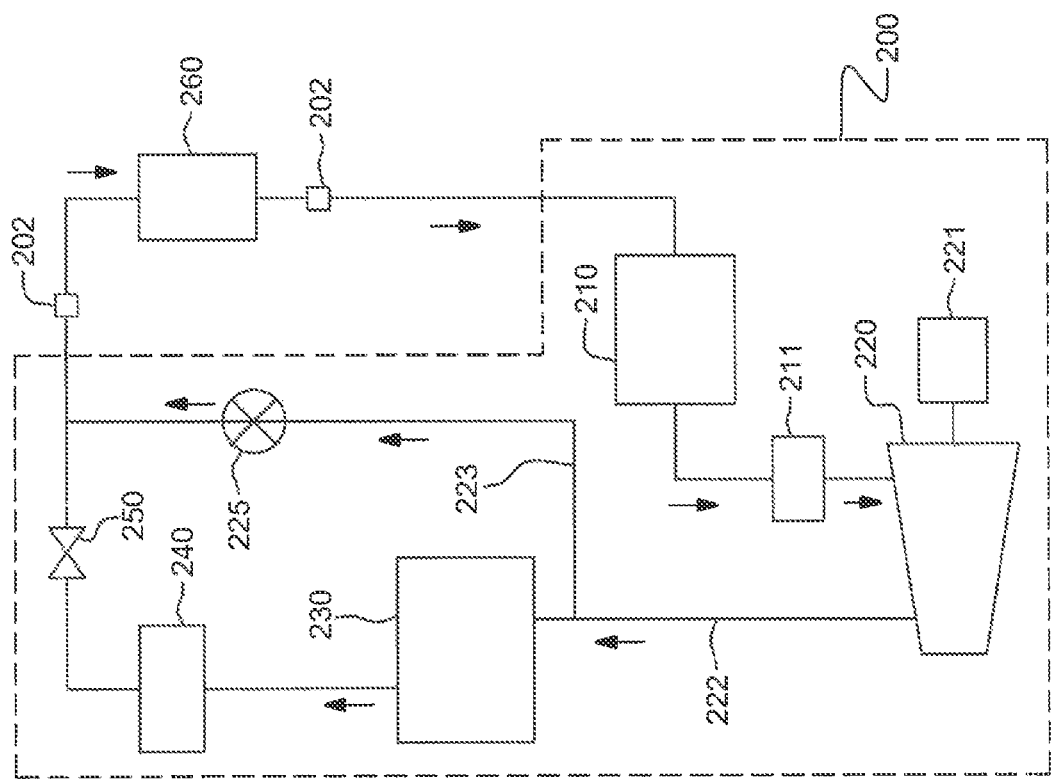
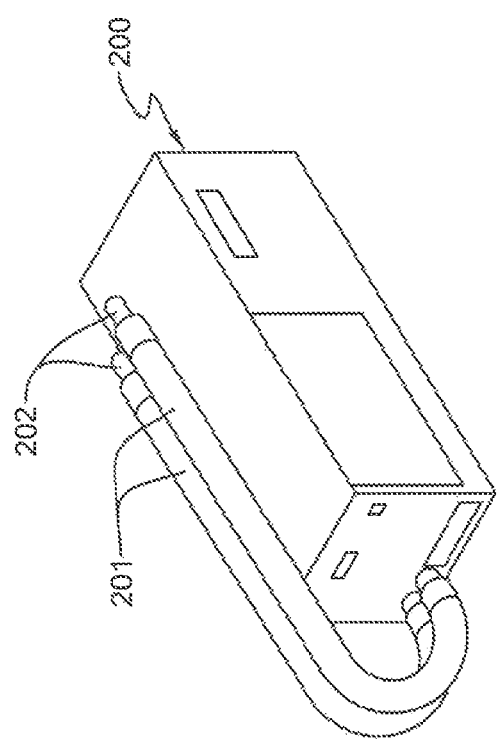

THERMOELECTRIC-ENHANCED, VAPOR-COMPRESSION REFRIGERATION APPARATUS FACILITATING COOLING OF AN ELECTRONIC COMPONENT

BACKGROUND

The present invention relates to heat transfer mechanisms, and more particularly, to cooling apparatuses, liquid-cooled electronics racks and methods of fabrication thereof for removing heat generated by one or more electronic components of the electronics rack.

The power dissipation of integrated circuit chips, and the modules containing the chips, continues to increase in order to achieve increases in processor performance. This trend poses a cooling challenge at both the module and system levels. Increased airflow rates are needed to effectively cool higher power modules and to limit the temperature of the air that is exhausted into the computer center.

In many large server applications, processors along with their associated electronics (e.g., memory, disk drives, power supplies, etc.) are packaged in removable drawer configurations stacked within a rack or frame. In other cases, the electronics may be in fixed locations within the rack or frame. Typically, the components are cooled by air moving in parallel airflow paths, usually front-to-back, impelled by one or more air moving devices (e.g., fans or blowers). In some cases it may be possible to handle increased power dissipation within a single drawer by providing greater airflow, through the use of a more powerful air moving device(s) or by increasing the rotational speed (i.e., RPMs) of an existing air moving device. However, this approach is becoming problematic at the rack level in the context of a data center.

BRIEF SUMMARY

In one aspect, the shortcomings of the prior art are overcome and additional advantages are provided through the provision of an apparatus for facilitating dissipation of heat from at least one electronic component. The apparatus includes: a refrigerant loop, a compressor, and a controllable thermoelectric array. The refrigerant loop is configured for refrigerant to flow therethrough, wherein the refrigerant facilitates dissipation of heat from the at least one electronic component. The compressor is coupled in fluid communication with the refrigerant loop, wherein a first portion of the refrigerant loop resides upstream of a refrigerant inlet of the compressor, and a second portion of the refrigerant loop resides downstream of a refrigerant outlet of the compressor. The controllable thermoelectric array includes at least one thermoelectric module, and is disposed with the first portion of the refrigerant loop at least partially in thermal contact with a first side of the thermoelectric array and a second portion of the refrigerant loop at least partially in thermal contact with a second side of the thermoelectric array. The controllable thermoelectric array is controlled to ensure that the refrigerant in the refrigerant loop entering the compressor is in a superheated thermodynamic state by transferring heat from refrigerant passing through the second portion of the refrigerant loop to refrigerant passing through the first portion of the refrigerant loop.

In another aspect, a cooled electronic system is provided which includes at least one electronic component, and an apparatus for facilitating dissipation of heat from the at least one electronic component. The apparatus includes: a refrigerant loop, a compressor, and a controllable thermoelectric array. The refrigerant loop is configured for refrigerant to flow therethrough, wherein the refrigerant facilitates dissipation of heat from the at least one electronic component. The compressor is coupled in fluid communication with the refrigerant loop, and a first portion of the refrigerant loop resides upstream of a refrigerant inlet of the compressor, and a second portion of the refrigerant loop resides downstream of a refrigerant outlet of the compressor. The controllable thermoelectric array includes at least one thermoelectric module, and is disposed with the first portion of the refrigerant loop at least partially in thermal contact with a first side of the thermoelectric array and a second portion of the refrigerant loop at least partially in thermal contact with a second side of the thermoelectric array. The controllable thermoelectric array is controlled to ensure that the refrigerant in the refrigerant loop entering the compressor is in a superheated thermodynamic state by transferring heat from refrigerant passing through the second portion of the refrigerant loop to refrigerant passing through the first portion of the refrigerant loop.

In a further aspect, a method of facilitating dissipation of heat from at least one electronic component is provided. The method includes: providing a refrigerant loop configured for refrigerant to flow therethrough, the refrigerant facilitating dissipation of heat from the at least one electronic component; coupling a compressor in fluid communication with the refrigerant loop, wherein a first portion of the refrigerant loop resides upstream of a refrigerant inlet of the compressor, and a second portion of the refrigerant loop resides downstream of a refrigerant outlet of the compressor; and disposing a controllable thermoelectric array in thermal communication with the refrigerant loop, the controllable thermoelectric array comprising at least one thermoelectric module, and being disposed with the first portion of the refrigerant loop at least partially in thermal contact with a first side of the thermoelectric array and the second portion of the refrigerant loop at least partially in thermal contact with a second side of the thermoelectric array, the controllable thermoelectric array being controlled to ensure that refrigerant in the refrigerant loop entering the compressor is in a superheated thermodynamic state by transferring heat from refrigerant passing through the second portion of the refrigerant loop to refrigerant passing through the first portion of the refrigerant loop.

Additional features and advantages are realized through the techniques of the present invention. Other embodiments and aspects of the invention are described in detail herein and are considered a part of the claimed invention.

BRIEF DESCRIPTION OF THE SEVERAL VIEWS OF THE DRAWINGS

One or more aspects of the present invention are particularly pointed out and distinctly claimed as examples in the claims at the conclusion of the specification. The foregoing and other objects, features, and advantages of the invention are apparent from the following detailed description taken in conjunction with the accompanying drawings in which:

FIG. 2A is an isometric view of one embodiment of a modular refrigeration unit (MRU) and its quick connects for attachment to a cold plate and/or evaporator disposed within an electronics rack to cool one or more electronic components (e.g., modules) thereof, in accordance with an aspect of the present invention;

FIG. 2B is a schematic of one embodiment of a vapor-compression refrigeration system for cooling an evaporator (or cold plate) coupled to a high heat flux electronic component (e.g., module) to be cooled, in accordance with an aspect of the present invention;

DETAILED DESCRIPTION

Figure 1:
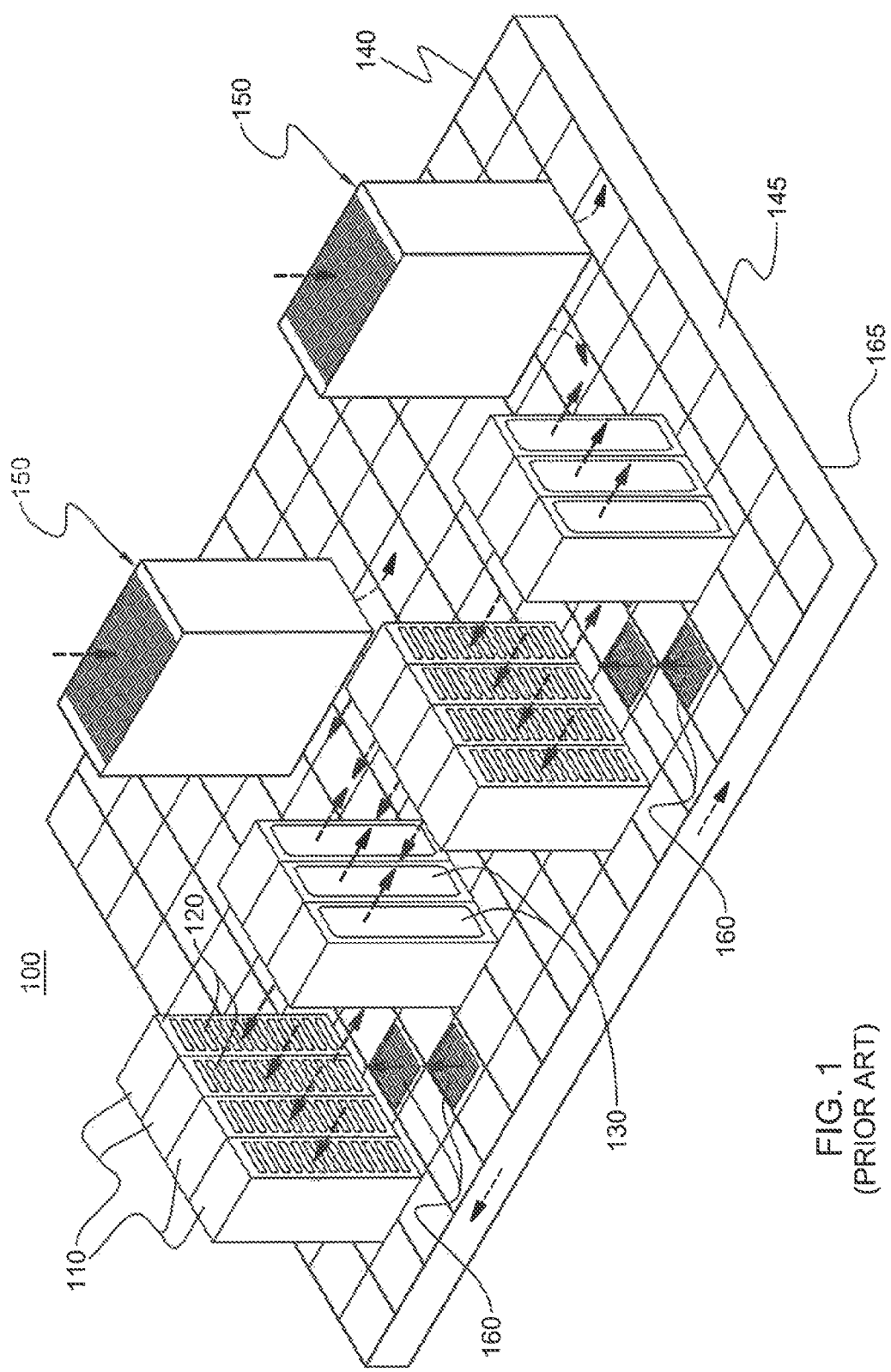
FIG. 1 depicts one embodiment of a conventional raised floor layout of an air-cooled data center.

As used herein, the terms "electronics rack", "rack-mounted electronic equipment", and "rack unit" are used interchangeably, and unless otherwise specified include any housing, frame, rack, compartment, blade server system, etc., having one or more heat generating components of a computer system or electronics system, and may be, for example, a stand alone computer processor having high, mid or low end processing capability. In one embodiment, an electronics rack may comprise multiple electronic subsystems, each having one or more heat generating components disposed therein requiring cooling. "Electronic subsystem" refers to any sub-housing, blade, book, drawer, node, compartment, etc., having one or more heat generating electronic components disposed therein. Each electronic subsystem of an electronics rack may be movable or fixed relative to the electronics rack, with rack-mounted electronics drawers of a multi-drawer rack unit and blades of a blade center system being two examples of subsystems of an electronics rack to be cooled.

"Electronic component" refers to any heat generating electronic component or module of, for example, a computer system or other electronic unit requiring cooling. By way of example, an electronic component may comprise one or more integrated circuit dies and/or other electronic devices to be cooled, including one or more processor dies, memory dies and memory support dies. As a further example, the electronic component may comprise one or more bare dies or one or more packaged dies disposed on a common carrier.

As used herein, "refrigerant-to-air heat exchanger" means any heat exchange mechanism characterized as described herein through which refrigerant coolant can circulate; and includes, one or more discrete refrigerant-to-air heat exchangers coupled either in series or in parallel. A refrigerant-to-air heat exchanger may comprise, for example, one or more coolant flow paths, formed of thermally conductive tubing (such as copper or other tubing) in thermal or mechanical contact with a plurality of air-cooled cooling or condensing fins. Size, configuration and construction of the refrigerant-to-air heat exchanger can vary without departing from the scope of the invention disclosed herein.

Unless otherwise specified, "refrigerant evaporator" refers to a heat-absorbing mechanism or structure coupled to a refrigeration loop. The refrigerant evaporator is alternatively referred to as a "sub-ambient evaporator" when temperature of the refrigerant passing through the refrigerant evaporator is below the temperature of ambient air entering the electronics rack. Within the refrigerant evaporator, heat is absorbed by evaporating the refrigerant of the refrigerant loop. Still further, "data center" refers to a computer installation containing one or more electronics racks to be cooled. As a specific example, a data center may include one or more rows of rack-mounted computing units, such as server units.

As used herein, the phrase "controllable thermoelectric array" refers to an adjustable thermoelectric array which allows active control of an auxiliary heat load applied to refrigerant passing through the refrigerant loop of a cooling apparatus, in a manner as described herein. In one example, the controllable thermoelectric array comprises one or more thermoelectric modules, each comprising one or more thermoelectric elements, coupled in thermal communication with the refrigerant passing through the compressor and powered by an electrical power source.

One example of the refrigerant employed in the examples below is R134a refrigerant. However, the concepts disclosed herein are readily adapted to use with other types of refrigerant. For example, the refrigerant may alternatively comprise R245fa, R404, R12, or R22 refrigerant.

Reference is made below to the drawings, which are not drawn to scale for ease of understanding, wherein the same reference numbers used throughout different figures designate the same or similar components.

FIG. 1 depicts a raised floor layout of an air cooled data center 100 typical in the prior art, wherein multiple electronics racks 110 are disposed in one or more rows. A data center such as depicted in FIG. 1 may house several hundred, or even several thousand microprocessors. In the arrangement illustrated, chilled air enters the computer room via perforated floor tiles 160 from a supply air plenum 145 defined between the raised floor 140 and a base or sub-floor 165 of the room. Cooled air is taken in through louvered or screened doors at air inlet sides 120 of the electronics racks and expelled through the back (i.e., air outlet sides 130) of the electronics racks. Each electronics rack 110 may have one or more air moving devices (e.g., fans or blowers) to provide forced inlet-to-outlet airflow to cool the electronic components within the drawer(s) of the rack. The supply air plenum 145 provides conditioned and cooled air to the air-inlet sides of the electronics racks via perforated floor tiles 160 disposed in a "cold" aisle of the computer installation. The conditioned and cooled air is supplied to plenum 145 by one or more air conditioning units 150, also disposed within the data center 100. Room air is taken into each air conditioning unit 150 near an upper portion thereof. This room air comprises in part exhausted air from the "hot" aisles of the computer installation defined by opposing air outlet sides 130 of the electronics racks 110.

In high performance server systems, it has become desirable to supplement air-cooling of selected high heat flux electronic components, such as the processor modules, within the electronics rack. For example, the System z® server marketed by International Business Machines Corporation, of Armonk, N.Y., employs a vapor-compression refrigeration cooling system to facilitate cooling of the processor modules within the electronics rack. This refrigeration system employs R134a refrigerant as the coolant, which is supplied to a refrigerant evaporator coupled to one or more processor modules to be cooled. The refrigerant is provided by a modular refrigeration unit (MRU), which supplies the refrigerant at an appropriate temperature.

FIG. 2A depicts one embodiment of a modular refrigeration unit 200, which may be employed within an electronic rack, in accordance with an aspect of the present invention. As illustrated, modular refrigeration unit 200 includes refrigerant supply and exhaust hoses 201 for coupling to a refrigerant evaporator or cold plate (not shown), as well as quick connect couplings 202, which respectively connect to corresponding quick connect couplings on either side of the refrigerant evaporator, that is coupled to the electronic component(s) or module(s) (e.g., server module(s)) to be cooled. Further details of a modular refrigeration unit such as depicted in FIG. 2A are provided in commonly assigned U.S. Pat. No. 5,970,731.

FIG. 2B is a schematic of one embodiment of modular refrigeration unit 200 of FIG. 2A, coupled to a refrigerant evaporator for cooling, for example, an electronic component within an electronic subsystem of an electronics rack. The electronic component may comprise, for example, a multi-chip module, a processor module, or any other high heat flux electronic component (not shown) within the electronics rack. As illustrated in FIG. 2B, a refrigerant evaporator 260 is shown that is coupled to the electronic component (not shown) to be cooled and is connected to modular refrigeration unit 200 via respective quick connect couplings 202. Within modular refrigeration unit 200, a motor 221 drives a compressor 220, which is connected to a condenser 230 by means of a supply line 222. Likewise, condenser 230 is connected to evaporator 260 by means of a supply line which passes through a filter/dryer 240, which functions to trap particulate matter present in the refrigerant stream and also to remove any water which may have become entrained in the refrigerant flow. Subsequent to filter/dryer 240, refrigerant flow passes through an expansion device 250. Expansion device 250 may be an expansion valve. However, it may also comprise a capillary tube or thermostatic valve. Thus, expanded and cooled refrigerant is supplied to evaporator 260. Subsequent to the refrigerant picking up heat from the electronic component coupled to evaporator 260, the refrigerant is returned via an accumulator 210 which operates to prevent liquid from entering compressor 220. Accumulator 210 is also aided in this function by the inclusion of a smaller capacity accumulator 211, which is included to provide an extra degree of protection against the entry of liquid-phase refrigerant into compressor 220. Subsequent to accumulator 210, vapor-phase refrigerant is returned to compressor 220, where the cycle repeats. In addition, the modular refrigeration unit is provided with a hot gas bypass valve 225 in a bypass line 223 selectively passing hot refrigerant gasses from compressor 220 directly to evaporator 260. The hot gas bypass valve is controllable in response to the temperature of evaporator 260, which is provided by a module temperature sensor (not shown), such as a thermistor device affixed to the evaporator/cold plate in any convenient location. In one embodiment, the hot gas bypass valve is electronically controlled to shunt hot gas directly to the evaporator when temperature is already sufficiently low. In particular, under low temperature conditions, motor 221 runs at a lower speed in response to the reduced thermal load. At these lower speeds and loads, there is a risk of motor 221 stalling. Upon detection of such a condition, the hot gas bypass valve is opened in response to a signal supplied to it from a controller of the modular refrigeration unit.

Figure 3:
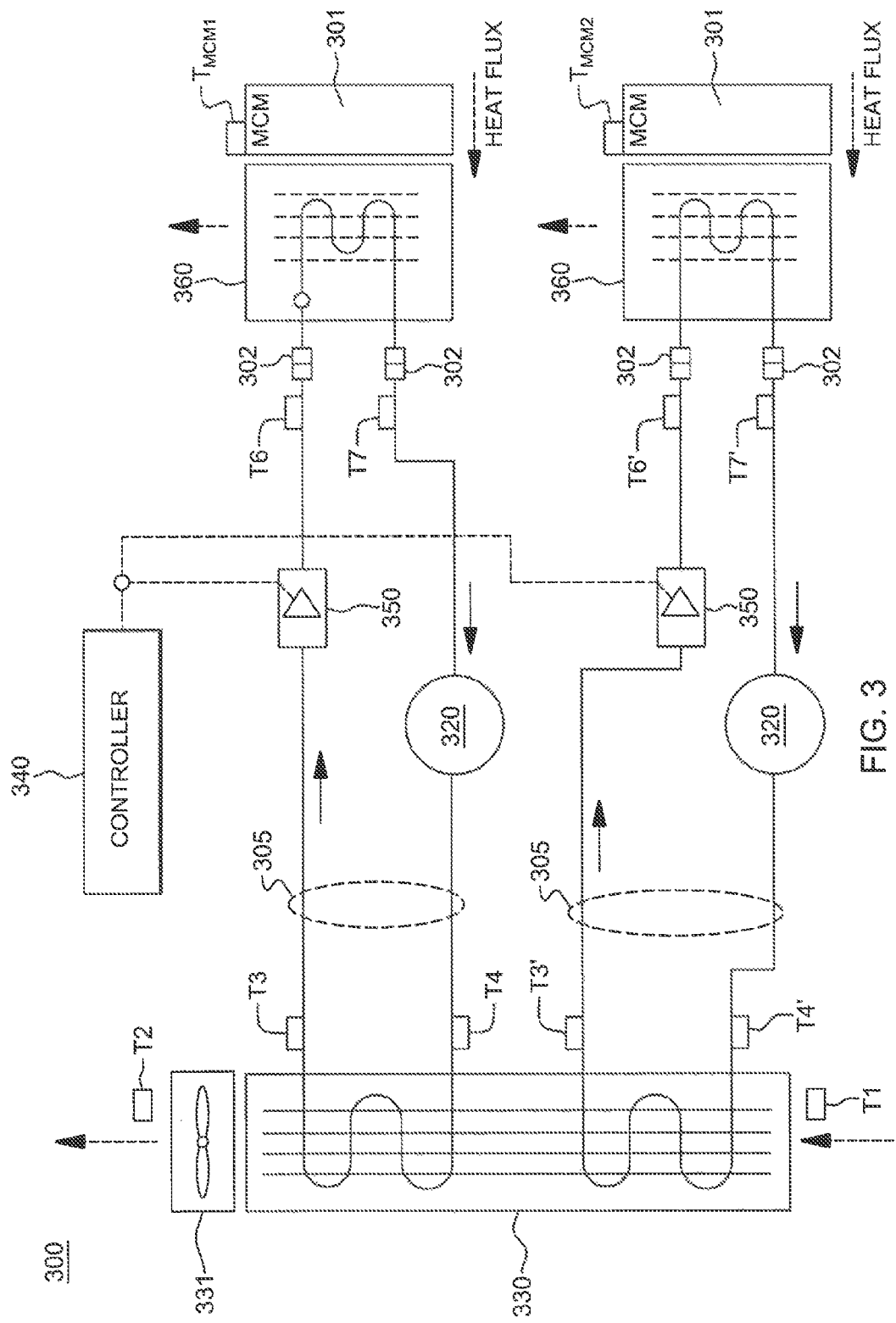
FIG. 3 is an schematic of an alternate embodiment of a vapor-compression refrigeration system for cooling multiple evaporators coupled to respective electronic components to be cooled, in accordance with an aspect of the present invention.

FIG. 3 depicts an alternate embodiment of a modular refrigeration unit 300, which may be employed within an electronics rack, in accordance with an aspect of the present invention. Modular refrigeration unit 300 includes (in this example) two refrigerant loops 305, or i.e., sets of refrigerant supply and exhaust hoses, coupled to respective refrigerant evaporators (or cold plates) 360 via quick connect couplings 302. Each refrigerant evaporator 360 is in thermal communication with a respective electronic component 301 (e.g., multichip module (MCM)) for facilitating cooling thereof. Refrigerant loops 305 are independent, and shown to include a compressor 320, a respective condenser section of a shared condenser 330 (i.e., a refrigerant-to-air heat exchanger), an air-moving device 331, and an expansion (and flow control) valve 350, which is employed by a controller 340 to maintain temperature of the electronic component at a steady temperature level, e.g., 29° C. In one embodiment, the expansion valves 350 are controlled by controller 340 with reference to temperature of the respective electronic component 301 $T_{MCM1}$, $T_{MCM2}$. The refrigerant and coolant loops may also contain further sensors, such as sensors for condenser air temperature in T1, condenser air temperature out T2, temperature T3, T3' of high-pressure liquid refrigerant flowing from the condenser 330 to the respective expansion valve 350, temperature T4, T4' of high-pressure refrigerant vapor flowing from each compressor 320 to the respective condenser section 330, temperature T6, T6' of low-pressure liquid refrigerant flowing from each expansion valve 350 into the respective evaporator 360, and temperature T7, T7' of low-pressure vapor refrigerant flowing from the respective evaporator 360 towards the compressor 320. Note that in this implementation, the expansion valves 350 operate to actively throttle the pumped refrigerant flow rate, as well as to function as expansion orifices to reduce the temperature and pressure of refrigerant passing through it.

In situations where electronic component 301 temperature decreases (i.e., the heat load decreases), the respective expansion valve 350 is partially closed to reduce the refrigerant flow passing through the associated evaporator 360 in an attempt to control temperature of the electronic component. If temperature of the component increases (i.e., heat load increases), then the controllable expansion valve 350 is opened further to allow more refrigerant flow to pass through the associated evaporator, thus providing increased cooling to the component. In extreme conditions, there is the possibility of too much refrigerant flow being allowed to pass through the evaporator, possibly resulting in partially-evaporated fluid, (i.e., liquid-vapor mixture) being returned to the respective compressor, which can result in compressor valve failure due to excessive pressures being imposed on the compressor valve. There is also the possibility of particulate and chemical contamination over time resulting from oil break-down inside the loop accumulating within the controllable expansion valve. Accumulation of contamination within the valve can lead to both valve clogging and erratic valve behavior.

In accordance with an aspect of the present invention, an alternate implementation of a vapor-compression refrigeration apparatus is described below with reference to FIGS. 4-6. This alternate implementation does not require a mechanical flow control and adjustable expansion valve, such as described above in connection with the modular refrigeration unit of FIG. 3, and ensures that refrigerant entering the compressor is in a superheated thermodynamic state. (In the implementation of FIGS. 4-6, an air-cooled heat sink can also advantageously be provided coupled to the refrigerant evaporator to provide backup air-cooling to the electronic component should, for example, primary refrigeration cooling of the electronic component fail.)

Generally stated, disclosed herein is a thermoelectric-enhanced, vapor-compression refrigeration apparatus for facilitating dissipation of heat from one or more electronic components of, for example, an electronics rack. In one embodiment, one or more refrigerant evaporator(s) of the refrigeration system are conduction-coupled to the one or more electronic components to be cooled, with the heat load applied by the electronic component(s) to the refrigerant being variable, such that at design conditions, superheated vapor flows from the evaporator to the compressor, yet at lower loads, a liquid-vapor mixture might exit the refrigerant evaporator. In such a case, a controllable thermoelectric-enhanced, fluid-to-fluid heat exchange assembly is employed to add auxiliary heat to the refrigerant, and thereby ensure a superheated vapor flow to the refrigerant inlet of the compressor. Advantageously, the thermoelectric array draws heat from the compressed vapor exiting the compressor which further aids in the rejection of heat to take place in the condenser. The thermoelectric-enhanced, fluid-to-fluid heat exchange assembly is controlled by a controller which monitors the temperature and pressure of the refrigerant and adjusts the auxiliary heat load accordingly.

Figure 4:
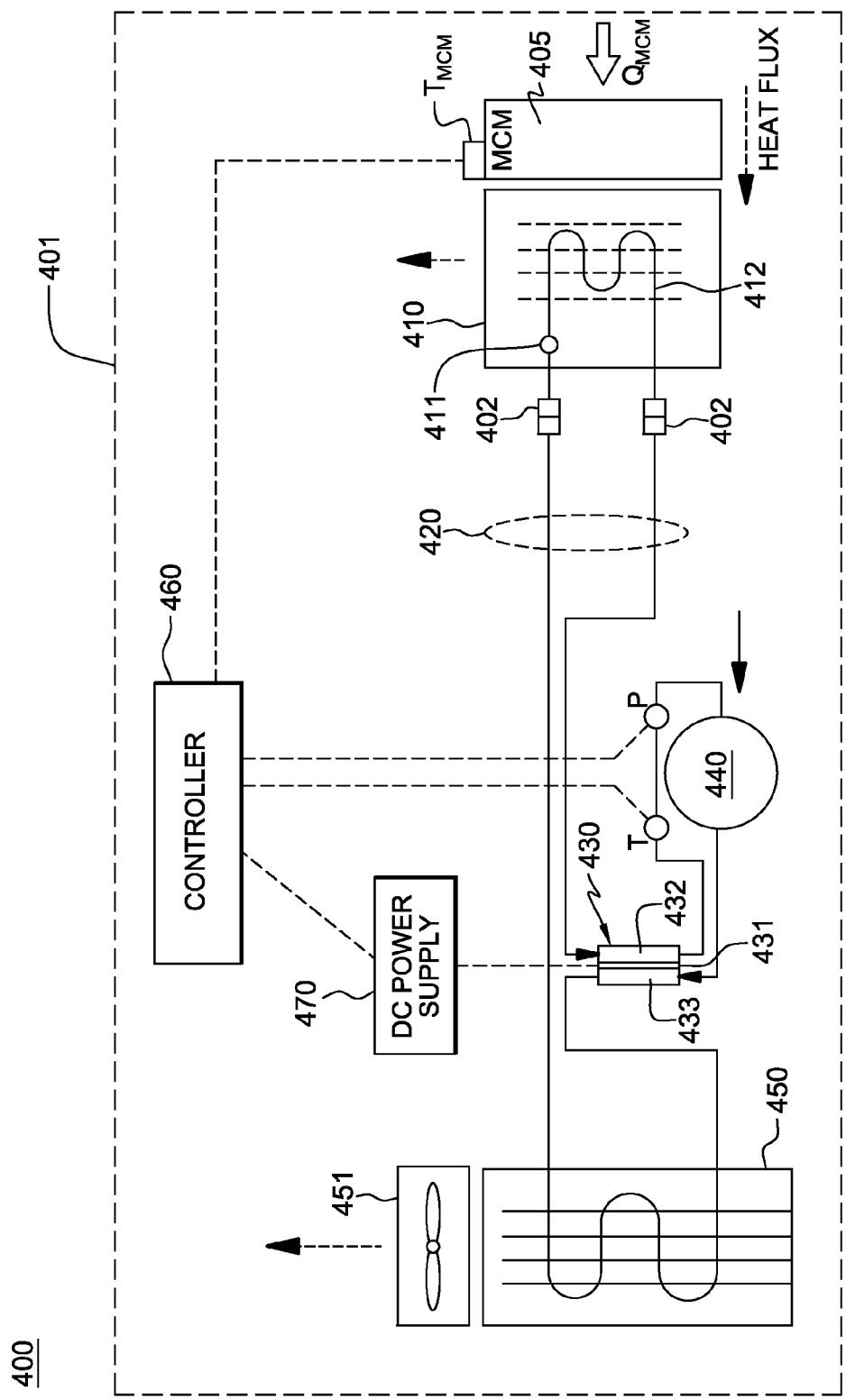
FIG. 4 is a schematic of one embodiment of a cooled electronic system comprising a thermoelectric-enhanced, vapor-compression refrigeration apparatus cooling one or more electronic components, in accordance with an aspect of the present invention.

FIG. 4 illustrates a cooled electronic system 400, which includes an electronics rack 401 comprising one or more electronic components 405 to be cooled. By way of example only, one or more of electronic components 405 to be cooled by the cooling apparatus may be a multichip module (MCM), such as a processor-based MCM. Note also that in the embodiment of FIG. 4, a single-loop, cooled electronic system is depicted by way of example only. Those skilled in the art should note that the vapor-compression refrigeration apparatus illustrated in FIG. 4 and described below can be readily configured for cooling multiple electronic components (either with or without employing a shared condenser, as in the example of FIG. 7 (described below)).

In the implementation of FIG. 4, the cooling apparatus is a vapor-compression refrigeration apparatus with a refrigerant heat load $Q_{MCM}$ applied by the electronic component(s). Refrigerant evaporator 410 is associated with the respective electronic component(s) 405 to be cooled, and a refrigerant loop 420 is coupled in fluid communication with refrigerant evaporator 410, to allow for the ingress and egress of refrigerant through the structure. Quick connect couplings 402 are provided, which facilitate coupling of refrigerant evaporator 410 to the remainder of the cooling apparatus. Refrigerant loop 420 is in fluid communication with a compressor 440, a condenser 450 and a filter/dryer (not shown). An air-moving device 451 facilitates airflow across condenser 450. In the embodiment of FIG. 4, refrigerant loop 420 also includes a fixed orifice expansion valve 411 associated with the refrigerant evaporator 410 and disposed, for example, at a refrigerant inlet to at least one channel 412 accommodating flow of refrigerant through the refrigerant evaporator 410.

By way of enhancement, FIG. 4 further illustrates incorporation of a thermoelectric-enhanced, liquid-to-liquid heat exchange assembly 430 in fluid communication with refrigerant loop 420. The thermoelectric-enhanced, liquid-to-liquid heat exchange assembly comprises a controllable thermoelectric array 431 disposed between a first heat exchange element 432 and a second heat exchange element 433. Thermoelectric-enhanced, fluid-to-fluid heat exchange assembly 430 is positioned and configured to controllably pump heat from the high-pressure gas refrigerant exiting compressor 440 to the refrigerant in the refrigerant loop about to enter the refrigerant inlet of compressor 440 to ensure that the refrigerant entering the compressor is in a superheated thermodynamic state. The use of thermoelectric elements to electronically transfer heat is known in the art, as represented by U.S. Pat. No. 6,557,354 B1, wherein the use of thermoelectric elements to facilitate the transfer of heat from, for example, a coolant, such as a water stream, to a warmer air stream, is described.

Thermoelectric control of the auxiliary heating applied to the refrigerant provides a number of advantages. For example, the thermoelectric module heat pumping capability is readily adjustable up or down by varying the electric current passing through the thermoelectric array. In general, a thermoelectric array's maximum heat pumping capability is proportional to the number of thermoelectric couples used, so the array can be readily scaled and modularized from small to large, depending upon the heat transfer rate desired. Since thermoelectric arrays operate electrically with no moving parts, they are essentially maintenance-free, and offer high reliability. Although reliability may be somewhat application-dependent, the life span of a typical thermoelectric element is greater than 200,000 hours. Unlike other heat dissipation approaches, a thermoelectric module generates virtually no electrical noise and is acoustically silent. Thermoelectric devices are also "friendly" to the environment, since they do not require the use of refrigerants or other gases.

Figure 5:
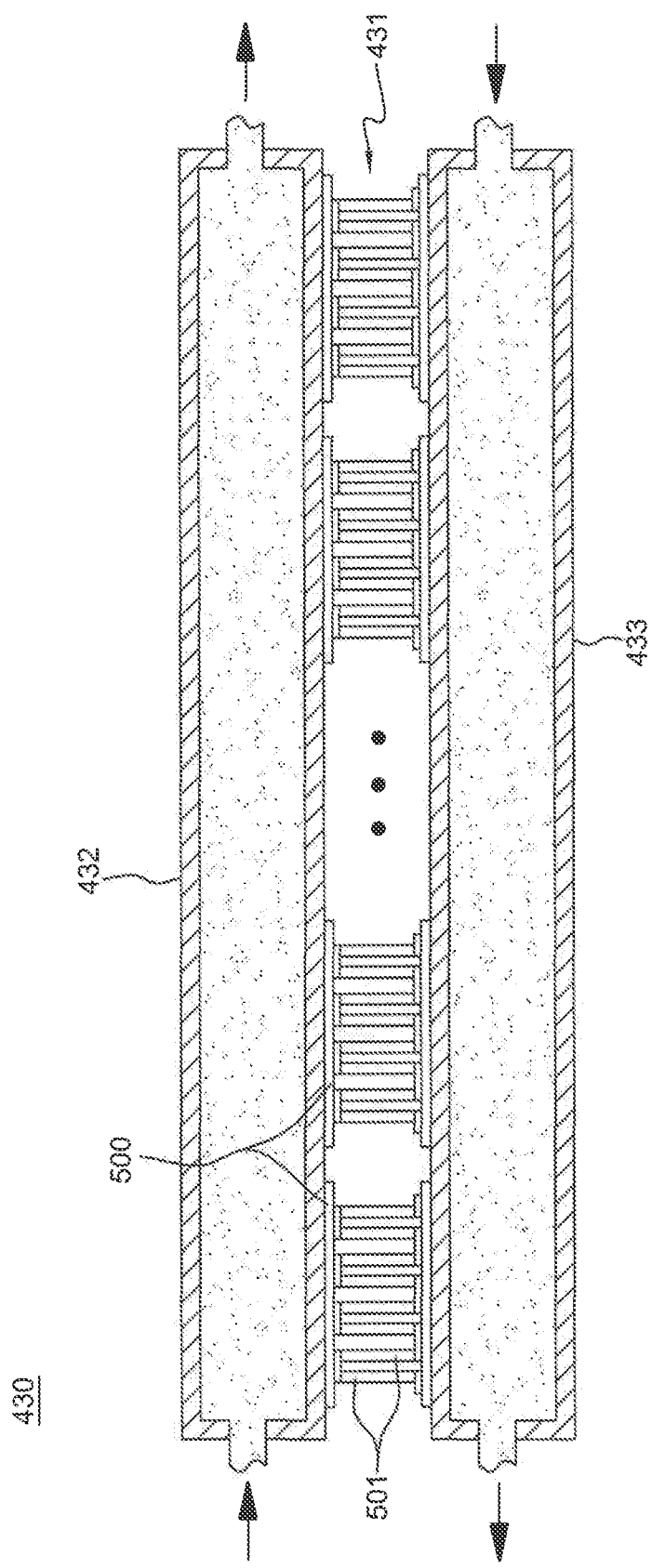
FIG. 5 is a cross-sectional elevational view of one embodiment of a thermoelectric-enhanced, fluid-to-fluid heat exchange assembly for the thermoelectric-enhanced, vapor-compression refrigeration apparatus of FIG. 4, in accordance with an aspect of the present invention.

FIG. 5 is a cross-sectional elevational view of one embodiment of a thermoelectric-enhanced, fluid-to-fluid heat exchange assembly 430, in accordance with an aspect of the present invention. In this example, first heat exchange element 432 is, as one example, a liquid-cooled cold plate, and second heat exchange element 433 is a second liquid-cooled cold plate, wherein refrigerant through first and second portions of the refrigerant loop (upstream and downstream, respectively, of the compressor) ingresses and egresses through the respective cold plate. Thermoelectric array 431 comprises, in this example, a plurality of thermoelectric modules 500, each of which comprises individual thermoelectric elements 501.

The use of large thermoelectric cooling elements is known. These elements operate electronically to produce a cooling effect. By passing a direct current through the legs of a thermoelectric device, a heat flow is produced across the device which may be contrary to that which would be expected from Fourier's law.

At one junction of the thermoelectric element, both holes and electrons move away, towards the other junction, as a consequence of the current flow through the junction. Holes move through the p-type material and electrons through the n-type material. To compensate for this loss of charge carriers, additional electrons are raised from the valence band to the conduction band to create new pairs of electrons and holes. Since energy is required to do this, heat is absorbed at this junction. Conversely, as an electron drops into a hole at the other junction, its surplus energy is released in the form of heat. This transfer of thermal energy from the cold junction to the hot junction is known as the Peltier effect.

Use of the Peltier effect permits the surfaces attached to a heat source to be maintained at a temperature below that of a surface attached to a heat sink. What these thermoelectric modules provide is the ability to operate the cold side below the ambient temperature of the cooling medium (e.g., air or water). When direct current is passed through the thermoelectric modules, a temperature difference is produced with the result that one side is relatively cooler than the other side.

These thermoelectric modules are therefore seen to possess a hot side and a cold side, and provide a mechanism for facilitating the transfer of thermal energy from the cold side of the thermoelectric module to the hot side of the thermoelectric module.

By way of specific example, thermoelectric modules 500 may comprise TEC CP-2-127-06L modules, offered by Meteor Laird, of Cleveland, Ohio.

Note that the thermoelectric array may comprise any number of thermoelectric modules, including one or more modules, and is dependent (in part) on the size of the electronic modules, as well as the amount of heat to be transferred from refrigerant flowing through second heat exchange element 433, to refrigerant flowing through first heat exchange element 432. Also note that an insulative material (not shown) may be provided over one or more of the exposed surfaces of first heat exchange element 432 or second heat exchange element 433. As noted above, refrigerant within first heat exchange element 432 is selectively further heated to ensure that refrigerant entering compressor 440 (FIG. 4) is in the superheated thermodynamic state.

The thermoelectric (TE) array may comprise a planar thermoelectric array with modules arranged in a square or rectangular array. Although the wiring is not shown, each thermoelectric module in a column may be wired and supplied electric current (I) in series and the columns of thermoelectric modules may be electrically wired in parallel so that the total current supplied would be I×sqrt(M) for a square array comprising M thermoelectric modules, providing an appreciation of the inherent scalability of the array. In this way, if a single thermoelectric module should fail, only one column is effected, and electric current to the remaining columns may be increased to compensate for the failure.

Table 1 provides an example of the scalability provided by a planar thermoelectric heat exchanger configuration such as described herein.

TABLE 1

| Number of TE Modules (M) | Heat Exchanger Size |
|---|---|
| 81 | 585 mm × 585 mm (23.0 in. × 23.0 in.) |
| 100 | 650 mm × 650 mm (25.6 in. × 25.6 in.) |
| 121 | 715 mm × 715 mm (28.2 in. × 28.2 in.) |
| 144 | 780 mm × 780 mm (30.7 in. × 30.7 in.) |
| 169 | 845 mm × 845 mm (33.3 in. × 33.3 in.) |

For a fixed electric current and temperature difference across the thermoelectric modules, the heat pumped by the thermoelectric array will scale with the number of thermoelectric modules in the platform area. Thus, the heat load capability of a 650 mm×650 mm thermoelectric heat exchanger will be 1.23 times that of a 585 mm×585 mm thermoelectric heat exchanger, and that of an 845 mm×845 mm will be 2.09 times greater. Note that the size of the liquid-to-air heat exchanger may need to grow to accommodate the increased heat load. If the space available for the thermoelectric heat exchanger is constrained in the X×Y dimensions, then the heat pumping capabilities can still be scaled upwards by growing in the Z dimension. This can be done by utilizing multiple layers of thermoelectric modules between multiple heat exchange elements, with alternating hot and cold sides, as described in the above-referenced U.S. Pat. No. 6,557,354 B1.

Continuing with FIG. 4, a controller 460 is provided coupled in communication with one or more temperature sensor(s) T and one or more pressure sensor(s) P. Temperature sensor(s) T and pressure sensor(s) P are disposed to sense the temperature and pressure of refrigerant upstream of the refrigerant inlet to compressor 440. Using this information, controller 460 controls the electric current supplied by a DC power supply 470 to thermoelectric array 431. FIG. 6 depicts, by way of example, one embodiment of a control process which may be employed in connection with the thermoelectric-enhanced, vapor-compression refrigeration apparatus of FIGS. 4 & 5.

Figure 6:
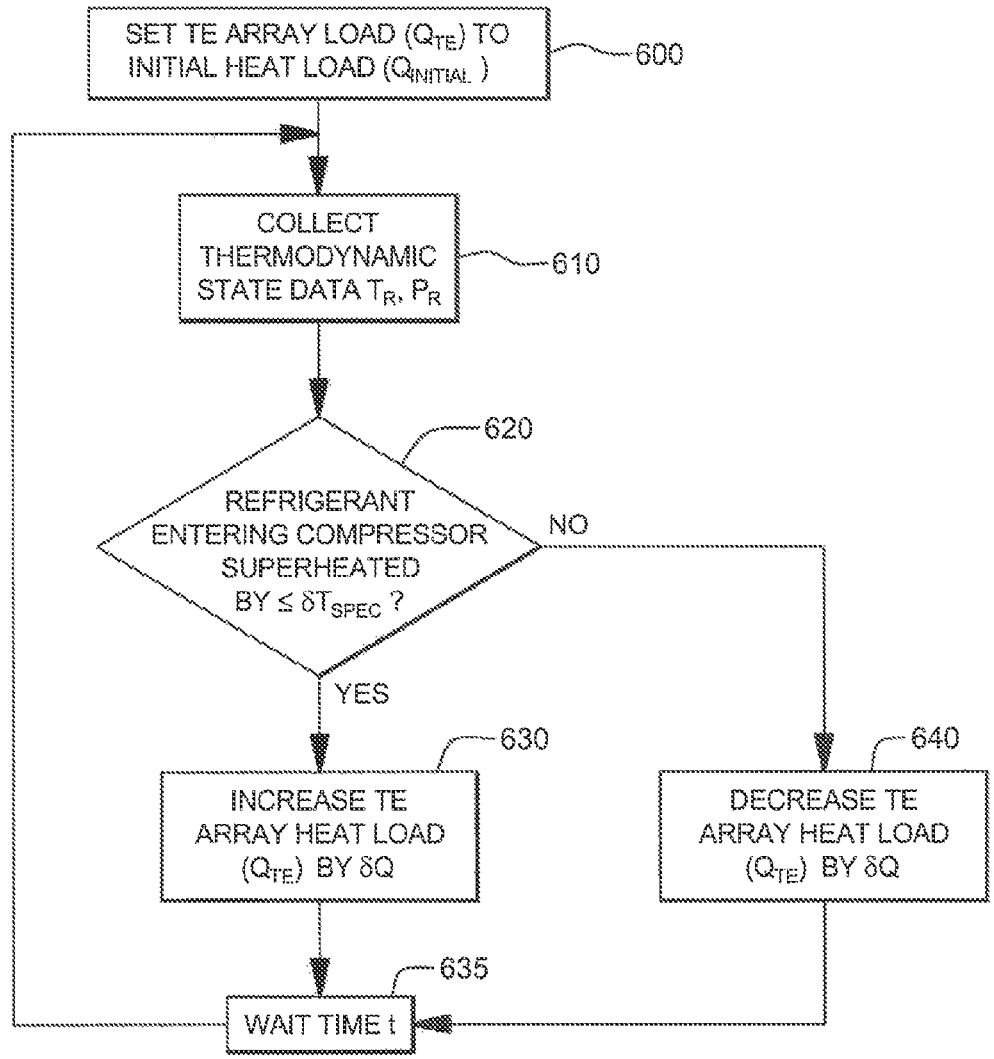
FIG. 6 is a flowchart of one embodiment of a process for maintaining refrigerant entering the compressor of the thermoelectric-enhanced, vapor-compression refrigerant apparatus of FIG. 4 in a superheated thermodynamic state, in accordance with an aspect of the present invention.

In the control process of FIG. 6, measurements of refrigerant temperature and refrigerant pressure at the inlet of the compressor are used to control the amount of heat load (or power) delivered by the controllable thermoelectric array. This auxiliary heat load is advantageously tailored to ensure that superheated vapor is received into the compressor, which in turn advantageously results in the elimination of the use of any adjustable expansion valve(s), which might otherwise be used, and be susceptible to fouling.

Referring to FIG. 6, a superheated thermodynamic state is ensured by first setting the heat load applied to the refrigerant by the controllable thermoelectric array ($Q_{TE}$) equal to an initial (or nominal) heat load value ($Q_{INITIAL}$) 600. The temperature of refrigerant ($T_R$) and pressure of refrigerant ($P_R$) at the inlet of the compressor are collected to determine the current thermodynamic state of the refrigerant 610. Processing then determines whether refrigerant entering the compressor is in a superheated state by less than or equal to a specified temperature difference ($\delta T_{SPEC}$) from the absolute value of refrigerant temperature at superheated condition 620. In one example, $\delta T_{SPEC}$ may be 2° C. This determination can be performed, by way of example, using a table look-up based on known thermodynamic properties of the refrigerant. By way of specific example, pressure (P)-enthalpy (H) diagrams for R134a refrigerant are available in the literature which indicate the regions in which the refrigerant is subcooled, saturated and superheated. These diagrams or functions utilize variables such as pressure and temperature (enthalpy if the quality of a two-phase mixture needs to be known). Thus, the thermodynamic state of the refrigerant can be determined using pressure and temperature data and subsequently controlled using the addition of the auxiliary heat load, if required. The pressure and temperature values measured can be input into a refrigerant-dependent algorithm (defined by the P-H diagram and properties of the refrigerant) that determines if the refrigerant is superheated (or is saturated or is in liquid phase). It is desired that the coolant entering the compressor be slightly superheated, that is, with no liquid content. The extent of superheat can be characterized using a $\delta T_{SPEC}$ value, which is predetermined. It is undesirable to have a very high extent of refrigerant superheat, because this would mean that a substantial heat load has been added to the refrigerant, even after the refrigerant has completely changed from liquid to gas phase. This is considered unnecessary for compressor reliability, and would lead to highly inefficient refrigeration loop operation. It is desired to add only as much auxiliary heat load as needed to maintain a small degree of superheat for the refrigerant entering the compressor to ensure reliable compressor operation. Therefore, if the refrigerant entering the compressor is superheated by less than a specified temperature difference ($\delta T_{SPEC}$), then the heat load applied by the controllable refrigerant heater is increased by a specified amount ($\delta Q$) 630. Alternatively, if the refrigerant entering the compressor is superheated by greater than the specified temperature difference ($\delta T_{SPEC}$), then the heat load applied by the controllable refrigerant heater is decreased by the specified amount (e.g., $\delta Q$) 640. After adjusting the heater heat load, processing waits a defined time (t) 635 before repeating the process by again collecting current thermodynamic state data for the refrigerant, that is, refrigerant temperature ($T_R$) and refrigerant pressure ($P_R$) at, for example, the inlet to the compressor 610.

Referring collectively to FIGS. 4-6, in operation, high-pressure liquid refrigerant exits the condenser and flows through an orifice (or capillary tube), experiencing a substantial pressure drop. The low-pressure refrigerant then evaporates at a temperature dictated by the pressure in the evaporator, with the orifice and its associated pressure characteristic having been designed to achieve a desired temperature at the electronic component being cooled. If the electronic component is dissipating its maximum amount of heat, then the refrigerant exiting the refrigerant evaporator is superheated vapor, but if the electronic component is dissipating less than its maximum heat load, then the refrigerant exiting the evaporator may be a mixture of liquid and vapor. The refrigerant then passes through a first portion of the refrigerant loop, that is, the first heat exchange element of the thermoelectric-enhanced, fluid-to-fluid heat exchange assembly, and if liquid and vapor refrigerant are present, the controller applies a differential voltage to the thermoelectric device to add an auxiliary heat load to the refrigerant stream, such that the temperature and pressure of refrigerant entering the compressor is ensured to be superheated to a predetermined amount above saturation temperature. The compressor impels and pressurizes the refrigerant vapor, which then passes through the second portion of the refrigerant loop, which includes the second heat exchange element of the thermoelectric-enhanced, fluid-to-fluid heat exchange assembly. If auxiliary heat load is being added to the refrigerant upstream of the compressor, i.e., in the first heat exchange element, heat will be removed from the pressurized vapor in the second heat exchange element, via the thermoelectric array of the thermoelectric-enhanced, fluid-to-fluid heat exchange assembly.

The pressurized gas then passes through the condenser, where the refrigerant stream condenses to a high-pressure liquid and heat is expelled to the surroundings. The thermoelectric-enhanced, fluid-to-fluid heat exchange assembly functions to ensure superheated vapor is present at the compressor inlet, while advantageously removing heat from the refrigerant stream at the compressor outlet to aid the condenser. The heat pumping accomplished by the thermoelectric array is variable, dependent on the electrical current supplied to the thermoelectric array. Thus, the variable expansion valve can be eliminated. Advantageously, the apparatus presented herein pumps (in one embodiment) only enough heat from the high pressure vapor to the compressor inlet stream to ensure that no liquid refrigerant enters the compressor. The quantity of heat required to fully vaporize the inlet stream is the sum of the power required to operate the thermoelectric heat exchanger and the heat pumped by the thermoelectric heat exchanger. The power required to operate the apparatus presented herein is therefore always less than the heat required to vaporize the refrigerant upstream of the compressor (by the amount of heat pumped from the high pressure vapor to the compressor suction side). Furthermore, the load on the condenser is reduced compared to an approach which uses, for example, a heater to ensure superheated vapor at the compressor inlet, since the only addition to the heat load of the refrigeration cycle by the apparatus disclosed herein is the heat dissipated by the thermoelectric modules rather than the total amount of heat required to fully vaporize the compressor inlet stream.

Figure 7:
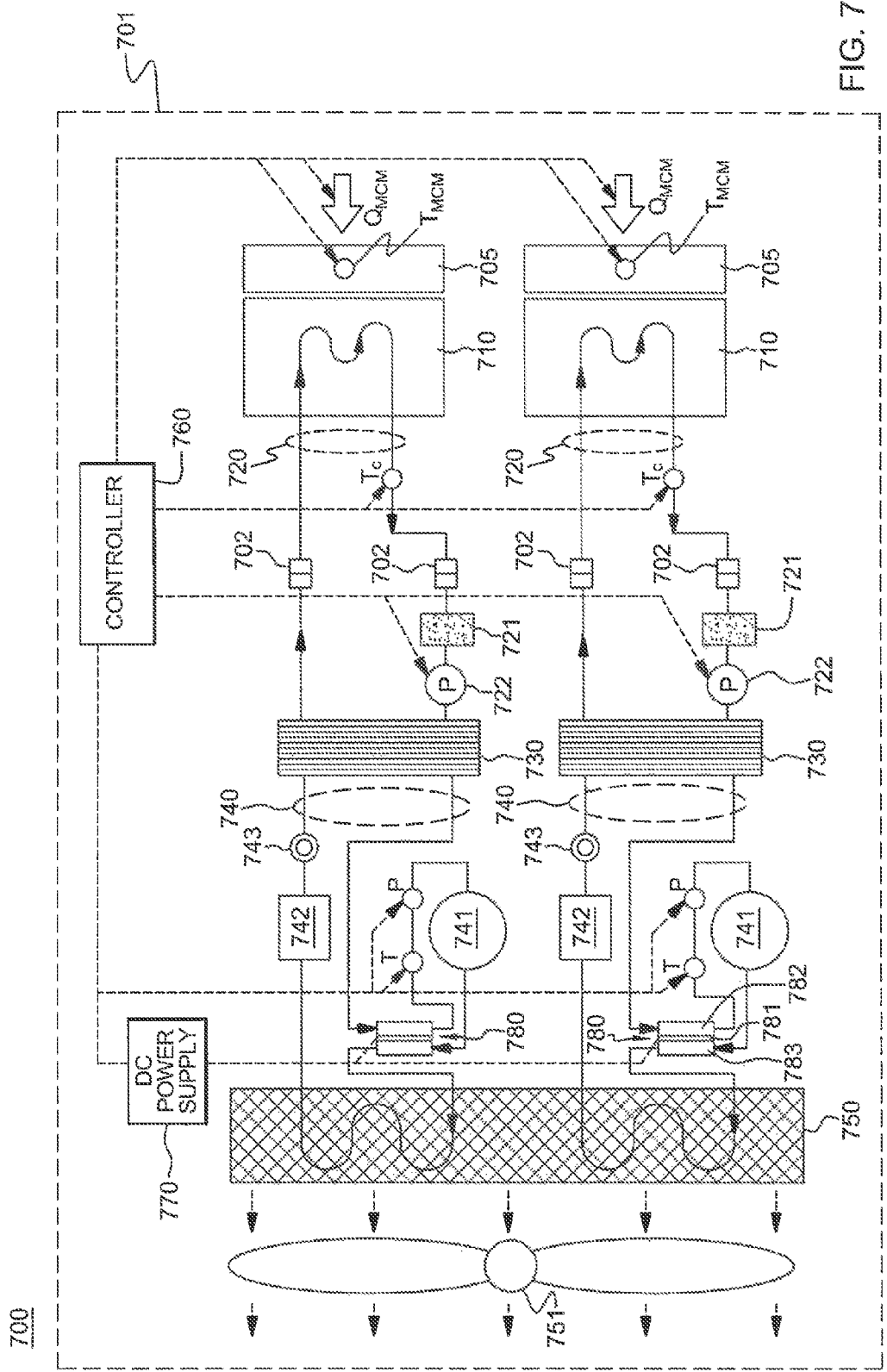
FIG. 7 is a schematic of one embodiment of a cooled electronic system comprising a coolant-buffered, thermoelectric-enhanced, vapor-compression refrigeration apparatus for cooling one or more evaporators coupled to one or more respective electronic components to be cooled, in accordance with an aspect of the present invention.

In accordance with another aspect of the present invention, FIG. 7 depicts an alternate implementation of a cooled electronic system which does not require a mechanical flow control and an adjustable expansion valve within the refrigerant loop, such as described above in connection with the modular refrigeration unit of FIG. 3, and which ensures that refrigerant enters the compressor of the vapor-compressor refrigeration subsystem in a superheated thermodynamic state. In the embodiment of FIG. 7, a dual-loop, cooled electronic system is depicted by way of example. Those skilled in the art should note that the cooling apparatus depicted therein and described below can be readily configured for cooling a single electronic component, or a plurality of electronic components (either with or without employing a shared condenser, as in the example of FIG. 7).

As shown in FIG. 7, cooled electronic system 700 includes an electronics rack 701 which comprises multiple electronic components 705 to be cooled. By way of specific example, each electronic component 705 to be cooled by the cooling apparatus may be a multichip module (MCM), such as a processor MCM. In the illustrated implementation, the apparatus is a coolant-buffered, thermoelectric-enhanced, vapor-compression refrigeration apparatus, with a controlled refrigerant state at the compressor inlet. Coolant buffering is achieved by associating a coolant-cooled structure 710 with a respective electronic component 705 to be cooled. A coolant loop 720 is coupled in fluid communication with coolant-cooled structure 710 to allow for the ingress and egress of coolant through the structure, and quick connect couplings 702 facilitate coupling of coolant-cooled structure 710 to the balance of the respective cooling apparatus. Each coolant loop 720 is also in fluid communication with a coolant reservoir 721, a coolant pump 722 (which may be adjustable, depending on the implementation), and a coolant-to-refrigerant heat exchanger 730. In one example, coolant flowing through coolant loop 720 is water, however, other coolants may alternatively be employed. If a dielectric coolant is employed, then liquid-cooled structure 710 may comprise a sealable housing, which facilitates immersion-cooling of electronic component 705.

Each respective vapor-compression refrigeration subsystem of the cooling apparatus includes a refrigerant loop 740 in fluid communication with coolant-to-refrigerant heat exchanger 730, a compressor 741, a condenser section passing through a shared condenser 750, a filter/dryer 742, and a fixed orifice valve 743. As illustrated, an air-moving device 751 facilitates airflow across shared condenser 750. Note that, in an alternate implementation, each vapor-compression refrigeration subsystem of the cooling apparatus could incorporate its own condenser and air-moving device.

A thermoelectric-enhanced, liquid-to-liquid heat exchange assembly 780 is coupled between first and second portions of the respective refrigerant loop 740, disposed upstream and downstream of compressor 741. As described above, thermoelectric-enhanced, liquid-to-liquid heat exchange assembly 780 includes a first heat exchange element 782 and a second heat exchange element 783, each of which is in fluid communication with a respective first and second portion of the refrigerant loop. The thermoelectric array 781 comprises, in one embodiment, multiple thermoelectric modules disposed between the first and second portions of the refrigerant loop, with the first heat exchange element 782 of the first portion of the refrigerant loop in thermal contact with a first side thereof, and the second heat exchange element 783 of the second portion of the refrigerant loop in thermal contact with a second side thereof. As with the embodiment of FIG. 4, heat exchange assembly 780 operates to transfer heat from the high-pressure refrigerant downstream of compressor 741 to a refrigerant within refrigerant loop 740 upstream of compressor 741. Temperature sensor(s) T and pressure sensor(s) P are disposed and associated with the first portion of refrigerant loop 740 (i.e., the upstream portion) to monitor the temperature and pressure of refrigerant. Controller 760 uses the monitored temperature and pressure information to control a DC power supply 770 powering the thermoelectric modules 781 of the respective thermoelectric-enhanced, liquid-to-liquid heat exchange assembly 780 to control the amount of heat being pumped to the refrigerant at the refrigerant inlet side of compressor 741 to ensure that the refrigerant at the inlet is in a superheated thermodynamic state, for example, in a manner such as described above in connection with FIG. 6.

In operation, each electronic component 705 applies a heat load ($Q_{MCM}$) to coolant passing through liquid-cooled structure 710. Coolant pump 722 circulates coolant through coolant loop 720. Refrigerant loop 740 absorbs the heat from the coolant passing through heat exchanger 730 and rejects this heat to an air stream via an air-cooled condenser 750. Advantageously, by ensuring that refrigerant passing into compressor 741 of the refrigerant loop is in a superheated thermodynamic state, compressor 741 can work at a fixed speed, and a fixed orifice 743 can be used within refrigerant loop 740 as an expansion valve for the vapor-compression refrigeration loop. The application of an adjustable, auxiliary heat load to the refrigerant by the thermoelectric-enhanced, liquid-to-liquid heat exchange assembly 780 means that the desired refrigerant state can be maintained at the refrigerant inlet of the compressor, allowing for a reliable design of the vapor-compression refrigeration subsystem.

As will be appreciated by one skilled in the art, aspects of the present invention may be embodied as a system, method or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system". Furthermore, aspects of the present invention may take the form of a computer program product embodied in one or more computer readable medium(s) having computer readable program code embodied thereon.

Any combination of one or more computer readable medium(s) may be utilized. The computer readable medium may be a computer readable signal medium or a computer readable storage medium. A computer readable signal medium may include a propagated data signal with computer readable program code embodied therein, for example, in baseband or as part of a carrier wave. Such a propagated signal may take any of a variety of forms, including, but not limited to, electro-magnetic, optical or any suitable combination thereof. A computer readable signal medium may be any computer readable medium that is not a computer readable storage medium and that can communicate, propagate, or transport a program for use by or in connection with an instruction execution system, apparatus or device.

A computer readable storage medium may be, for example, but not limited to, an electronic, magnetic, optical, electromagnetic, infrared or semiconductor system, apparatus, or device, or any suitable combination of the foregoing. More specific examples (a non-exhaustive list) of the computer readable storage medium include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain or store a program for use by or in connection with an instruction execution system, apparatus, or device.

Figure 8:
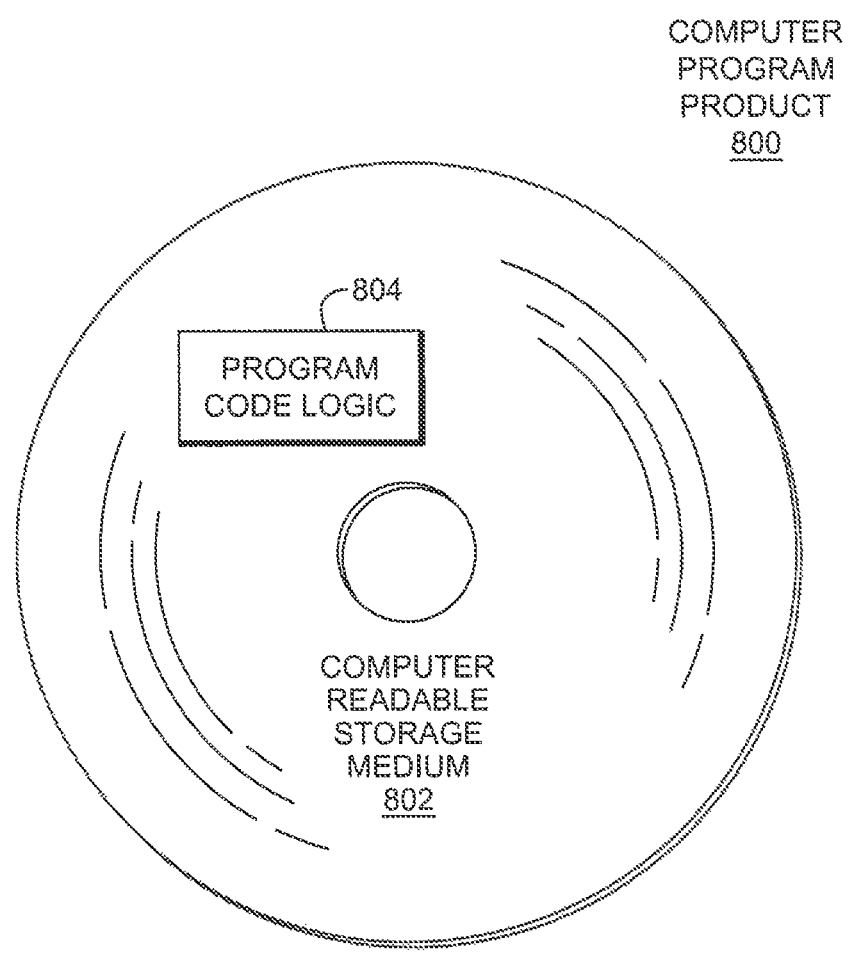
FIG. 8 depicts one embodiment of a computer program product incorporating one or more aspects of the present invention.

Referring now to FIG. 8, in one example, a computer program product 800 includes, for instance, one or more computer readable storage media 802 to store computer readable program code means or logic 804 thereon to provide and facilitate one or more aspects of the present invention.

Program code embodied on a computer readable medium may be transmitted using an appropriate medium, including but not limited to wireless, wireline, optical fiber cable, RF, etc., or any suitable combination of the foregoing.

Computer program code for carrying out operations for aspects of the present invention may be written in any combination of one or more programming languages, including an object oriented programming language, such as Java, Smalltalk, C++ or the like, and conventional procedural programming languages, such as the "C" programming language, assembler or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present invention are described herein with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

The flowchart and block diagrams in the figures illustrate the architecture, functionality, and operation of possible implementations of systems, methods and computer program products according to various embodiments of the present invention. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

In addition to the above, one or more aspects of the present invention may be provided, offered, deployed, managed, serviced, etc. by a service provider who offers management of customer environments. For instance, the service provider can create, maintain, support, etc. computer code and/or a computer infrastructure that performs one or more aspects of the present invention for one or more customers. In return, the service provider may receive payment from the customer under a subscription and/or fee agreement, as examples. Additionally or alternatively, the service provider may receive payment from the sale of advertising content to one or more third parties.

In one aspect of the present invention, an application may be deployed for performing one or more aspects of the present invention. As one example, the deploying of an application comprises providing computer infrastructure operable to perform one or more aspects of the present invention.

As a further aspect of the present invention, a computing infrastructure may be deployed comprising integrating computer readable code into a computing system, in which the code in combination with the computing system is capable of performing one or more aspects of the present invention.

As yet a further aspect of the present invention, a process for integrating computing infrastructure comprising integrating computer readable code into a computer system may be provided. The computer system comprises a computer readable medium, in which the computer medium comprises one or more aspects of the present invention. The code in combination with the computer system is capable of performing one or more aspects of the present invention.

Although various embodiments are described above, these are only examples. For example, computing environments of other architectures can incorporate and use one or more aspects of the present invention. Additionally, the network of nodes can include additional nodes, and the nodes can be the same or different from those described herein. Also, many types of communications interfaces may be used. Further, other types of programs and/or other optimization programs may benefit from one or more aspects of the present invention, and other resource assignment tasks may be represented. Resource assignment tasks include the assignment of physical resources. Moreover, although in one example, the partitioning minimizes communication costs and convergence time, in other embodiments, the cost and/or convergence time may be otherwise reduced, lessened, or decreased.

Further, other types of computing environments can benefit from one or more aspects of the present invention. As an example, an environment may include an emulator (e.g., software or other emulation mechanisms), in which a particular architecture (including, for instance, instruction execution, architected functions, such as address translation, and architected registers) or a subset thereof is emulated (e.g., on a native computer system having a processor and memory). In such an environment, one or more emulation functions of the emulator can implement one or more aspects of the present invention, even though a computer executing the emulator may have a different architecture than the capabilities being emulated. As one example, in emulation mode, the specific instruction or operation being emulated is decoded, and an appropriate emulation function is built to implement the individual instruction or operation.

In an emulation environment, a host computer includes, for instance, a memory to store instructions and data; an instruction fetch unit to fetch instructions from memory and to optionally, provide local buffering for the fetched instruction; an instruction decode unit to receive the fetched instructions and to determine the type of instructions that have been fetched; and an instruction execution unit to execute the instructions. Execution may include loading data into a register from memory; storing data back to memory from a register; or performing some type of arithmetic or logical operation, as determined by the decode unit. In one example, each unit is implemented in software. For instance, the operations being performed by the units are implemented as one or more subroutines within emulator software.

Further, a data processing system suitable for storing and/or executing program code is usable that includes at least one processor coupled directly or indirectly to memory elements through a system bus. The memory elements include, for instance, local memory employed during actual execution of the program code, bulk storage, and cache memory which provide temporary storage of at least some program code in order to reduce the number of times code must be retrieved from bulk storage during execution.

Input/Output or I/O devices (including, but not limited to, keyboards, displays, pointing devices, DASD, tape, CDs, DVDs, thumb drives and other memory media, etc.) can be coupled to the system either directly or through intervening I/O controllers. Network adapters may also be coupled to the system to enable the data processing system to become coupled to other data processing systems or remote printers or storage devices through intervening private or public networks. Modems, cable modems, and Ethernet cards are just a few of the available types of network adapters.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising", when used in this specification, specify the presence of stated features, integers, steps, operations, elements, and/or components, but do not preclude the presence or addition of one or more other features, integers, steps, operations, elements, components and/or groups thereof.

The corresponding structures, materials, acts, and equivalents of all means or step plus function elements in the claims below, if any, are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiment with various modifications as are suited to the particular use contemplated.

What is claimed is:

1. An apparatus for facilitating dissipation of heat from at least one electronic component, the apparatus comprising:
    a refrigerant loop configured for refrigerant to flow therethrough, the refrigerant facilitating dissipation of heat from the at least one electronic component;
    a compressor coupled in fluid communication with the refrigerant loop, wherein a first portion of the refrigerant loop resides upstream of a refrigerant inlet of the compressor, and a second portion of the refrigerant loop resides downstream of a refrigerant outlet of the compressor; and
    a controllable thermoelectric array comprising at least one thermoelectric module, the controllable thermoelectric array being disposed with the first portion of the refrigerant loop at least partially in thermal contact with a first side of the controllable thermoelectric array, and the second portion of the refrigerant loop at least partially in thermal contact with a second side of the controllable thermoelectric array, the controllable thermoelectric array being controlled to ensure that refrigerant in the refrigerant loop entering the compressor is in a superheated thermodynamic state by transferring heat from refrigerant passing through the second portion of the refrigerant loop to refrigerant passing through the first portion of the refrigerant loop; and
    a controller coupled to the controllable thermoelectric array via a controllable DC Power supply, the controller automatically controlling electric current by the controllable DC power supply to the controllable thermoelectric array to control an auxiliary heat load pumped by the controllable thermoelectric array from refrigerant passing, through the second portion to refrigerant passing through the first portion to automatically, incrementally increase the auxiliary heat load pumped by the controllable thermoelectric array responsive to refrigerant entering the compressor being superheated by less than a specified δT temperature threshold, and to automatically incrementally decrease the auxiliary heat load pumped by the controllable thermoelectric array responsive to refrigerant entering the compressor being superheated by greater than the specified δT temperature threshold.

2. The apparatus of claim 1, wherein the first portion and the second portion of the refrigerant loop are in series fluid communication, with the compressor disposed between the first portion and the second portion of the refrigerant loop.

3. The apparatus of claim 2, further comprising a condenser coupled in fluid communication with the refrigerant loop, wherein the second portion of the refrigerant loop is disposed in fluid communication with, and between, the compressor and the condenser.

4. The apparatus of claim 1, wherein the first portion of the refrigerant loop comprises a first heat exchange element and the second portion of the refrigerant loop comprises a second heat exchange element, and wherein refrigerant in the first portion of the refrigerant loop passes through the first heat exchange element and refrigerant in the second portion of the refrigerant loop passes through the second heat exchange element, and the first heat exchange element is in thermal communication with the first side of the thermoelectric array and the second heat exchange element is in thermal communication with the second side of the thermoelectric array.

5. The apparatus of claim 1, further comprising a refrigerant evaporator in thermal communication with the at least one electronic component, the refrigerant evaporator comprising at least one channel therein for accommodating flow of refrigerant therethrough, and wherein the refrigerant loop is coupled in fluid communication with the at least one channel of the refrigerant evaporator for facilitating flow of refrigerant therethrough.

6. The apparatus of claim 5, further comprising a fixed expansion orifice in fluid communication with the refrigerant loop for expanding refrigerant passing therethrough, the fixed expansion orifice being disposed at a refrigerant inlet to the refrigerant evaporator.

7. The apparatus of claim 1, wherein the apparatus further comprises a refrigerant temperature sensor and a refrigerant pressure sensor for monitoring a temperature and a pressure of refrigerant, respectively, within the first portion of the refrigerant loop.

8. The apparatus of claim 1, further comprising:
    a coolant-cooled structure, the coolant-cooled structure being coupled in thermal communication with the at least one electronic component;
    a coolant loop coupled in fluid communication with the coolant-cooled structure;
    a coolant-to-refrigerant heat exchanger coupled in fluid communication with the coolant-cooled structure via the coolant loop to receive coolant therefrom and provide coolant thereto, the coolant-to-refrigerant heat exchanger further being coupled in fluid communication with the refrigerant loop and cooling coolant passing therethrough by dissipating heat from the coolant passing therethrough to refrigerant passing therethrough.

9. A cooled electronic system comprising:
    at least one electronic component; and
    an apparatus for facilitating dissipation of heat from the at least one electronic component, the apparatus comprising:
        a refrigerant loop configured for refrigerant to flow therethrough, the refrigerant facilitating dissipation of heat from the at least one electronic component;
        a compressor coupled in fluid communication with the refrigerant loop, wherein a first portion of the refrigerant loop resides upstream of a refrigerant inlet of the compressor, and a second portion of the refrigerant loop resides downstream of a refrigerant outlet of the compressor;
        a controllable thermoelectric array comprising at least one thermoelectric module, the controllable thermoelectric array being disposed with the first portion of the refrigerant loop at least partially in thermal contact with a first side of the controllable thermoelectric array, and the second portion of the refrigerant loop at least partially in thermal contact with a second side of the controllable thermoelectric array, the controllable thermoelectric array being controlled to ensure that refrigerant in the refrigerant loop entering the compressor is in a superheated thermodynamic state by transferring heat from refrigerant passing through the second portion of the refrigerant loop to refrigerant passing through the first portion of the refrigerant loop; and a controller coupled to the controllable thermoelectric array, via a controllable DC Power supply, the controller automatically controlling electric current provided by the controllable DC power supply to the controllable thermoelectric array to control an auxiliary heat load pumped by the controllable thermoelectric array from refrigerant passing through the second portion to refrigerant passing through the first portion to automatically, incrementally increase the auxiliary heat load pumped by the controllable thermoelectric array responsive to refrigerant entering the compressor being superheated by less than a specified $\delta T$ temperature threshold, and to automatically, incrementally decrease the auxiliary heat load pumped by the controllable thermoelectric array responsive to refrigerant entering the compressor being superheated by greater than the specified $\delta T$ temperature threshold.

10. The cooled electronic system of claim 9, wherein the first portion and the second portion of the refrigerant loop are in series fluid communication, with the compressor disposed between the first portion and the second portion of the refrigerant loop.

11. The cooled electronic system of claim 10, further comprising a condenser coupled in fluid communication with the refrigerant loop, wherein the second portion of the refrigerant loop is disposed in fluid communication with, and between, the compressor and the condenser.

12. The cooled electronic system of claim 9, wherein the first portion of the refrigerant loop comprises a first heat exchange element and the second portion of the refrigerant loop comprises a second heat exchange element, and wherein refrigerant in the first portion of the refrigerant loop passes through the first heat exchange element and refrigerant in the second portion of the refrigerant loop passes through the second heat exchange element, and the first heat exchange element is in thermal communication with the first side of the thermoelectric array and the second heat exchange element is in thermal communication with the second side of the thermoelectric array.

13. The cooled electronic system of claim 9, further comprising a refrigerant evaporator in thermal communication with the at least one electronic component, the refrigerant evaporator comprising at least one channel therein for accommodating flow of refrigerant therethrough, and wherein, the refrigerant loop is coupled in fluid communication with the at least one channel of the refrigerant evaporator for facilitating flow of refrigerant therethrough.

14. The cooled electronic system of claim 13, further comprising a fixed expansion orifice in fluid communication with the refrigerant loop for expanding refrigerant passing therethrough, the fixed expansion orifice being disposed at a refrigerant inlet to the refrigerant evaporator.

15. The cooled electronic system of claim 9, wherein the apparatus further comprises a refrigerant temperature sensor and a refrigerant pressure sensor for monitoring a temperature and a pressure of refrigerant, respectively, within the first portion of the refrigerant loop.

16. The cooled electronic system of claim 9, further comprising:
a coolant-cooled structure, the coolant-cooled structure being coupled in thermal communication with the at least one electronic component;
a coolant loop coupled in fluid communication with the coolant-cooled structure;
a coolant-to-refrigerant heat exchanger coupled in fluid communication with the coolant-cooled structure via the coolant loop to receive coolant therefrom and provide coolant thereto, the coolant-to-refrigerant heat exchanger further being coupled in fluid communication with the refrigerant loop and cooling coolant passing therethrough by dissipating heat from the coolant passing therethrough to refrigerant passing therethrough.

\* \* \* \* \*